United States Patent
Furukawa et al.

[11] Patent Number: 5,998,835
[45] Date of Patent: Dec. 7, 1999

[54] HIGH PERFORMANCE MOSFET DEVICE WITH RAISED SOURCE AND DRAIN

[75] Inventors: Toshiharu Furukawa, Essex Junction; Mark C. Hakey; Steven J. Holmes, both of Milton; David V. Horak, Essex Junction, all of Vt.; William H. Ma, Fishkill; Jack A. Mandelman, Stormville, both of N.Y.

[73] Assignee: International Business Machines Corporation, Armonk, N.Y.

[21] Appl. No.: 09/024,840

[22] Filed: Feb. 17, 1998

[51] Int. Cl.⁶ .............................. H01L 29/78; H01L 29/50
[52] U.S. Cl. ......................... 257/330; 257/332; 257/333; 257/408
[58] Field of Search .................................... 257/332, 333, 257/330, 408

[56] References Cited

U.S. PATENT DOCUMENTS

| | | |
|---|---|---|
| 4,156,879 | 5/1979 | Lee . |
| 4,272,302 | 6/1981 | Jhabvala ................................ 257/330 |
| 4,685,196 | 8/1987 | Lee . |
| 4,803,173 | 2/1989 | Sill et al. . |
| 4,948,745 | 8/1990 | Pfiester et al. . |
| 5,105,242 | 4/1992 | Fujihira et al. . |
| 5,132,238 | 7/1992 | Murakami et al. . |
| 5,162,247 | 11/1992 | Hazani . |
| 5,300,447 | 4/1994 | Anderson . |
| 5,300,795 | 4/1994 | Saunier et al. . |
| 5,448,094 | 9/1995 | Hsu ......................................... 257/332 |
| 5,470,770 | 11/1995 | Takahashi et al. . |
| 5,583,064 | 12/1996 | Lee et al. . |

FOREIGN PATENT DOCUMENTS

| | | |
|---|---|---|
| 0299505 | 1/1989 | European Pat. Off. ............... 257/330 |
| 60-136265 | 7/1985 | Japan . |
| 2-105576 | 4/1990 | Japan ..................................... 257/330 |
| 8316347 | 11/1996 | Japan . |

Primary Examiner—Jerome Jackson, Jr.
Attorney, Agent, or Firm—Ratner & Prestia; Eugene I. Shkurko

[57] ABSTRACT

A MOSFET device and a method of manufacturing the device. The device has a trench formed in a silicon substrate. The channel of the device is at the bottom of the trench. Diffusion layers are formed adjacent to opposite sides of the trench. Each diffusion layer is connected to the edge of the device channel by extending the diffusion layer along the side wall of the trench and under a portion of the trench.

18 Claims, 7 Drawing Sheets

HIGH PERFORMANCE MOSFET DEVICE WITH RAISED SOURCE AND DRAIN

TECHNICAL FIELD

This invention relates generally to a semiconductor device and a method of manufacturing a semiconductor device. More specifically, this invention relates to a semiconductor device having a trench where the channel of the device is below the bottom surface of the trench and to a method of manufacturing the device.

BACKGROUND OF THE INVENTION

In the semiconductor industry, there is an incentive to reduce the size of each semiconductor device on a chip. For example, a smaller device can result in an increased density of devices on a chip and in a faster device. This allows increased functionality for a given size chip.

A smaller and faster MOSFET (metal oxide semiconductor field effect transistor) device may be realized by decreasing the channel length of the device. This generalization has its limits: as the channel length of a device is decreased beyond 0.1 $\mu$m, for example, device performance may not improve. As known to those skilled in the art, deviations in performance may be due to an increased series resistance of the source and drain diffusion regions of the device.

When the channel length of a MOSFET device is reduced to improve device performance, it may not be possible to simply scale the source and drain diffusion regions in proportion to the channel length reduction. Deeper source and drain diffusion regions are desirable for making source and drain contacts without increasing junction leakage and for reducing source and drain region resistance. Shallower source and drain regions are desirable, however, to reduce short-channel effects such as the drain-induced barrier-lowering and the sub-threshold leakage current of the device.

FIG. 1 shows a device 100 with a gate formed upon a substrate 105. The device 100 of FIG. 1 has deep junctions 110, 120 to form contacts having low junction leakage and has shallow diffusion extensions 115, 125 to reduce the short-channel effects. The device 100 includes isolation regions 150; diffusion contacts 140, 142; oxide regions 132, 134, 136; oxide or nitride spacers 166, 168; and a gate comprising a gate oxide 130, a heavily doped polysilicon gate 164, a gate conductor such as WSi$_x$ (Tungsten Silicide) 162, and a nitride or oxide cap 160.

When the length of the channel 180 is reduced, the lengths of diffusion extensions 115, 125 are not scaled proportionately. This provides sufficient distance between the deep junctions 110, 120 to reduce short-channel effects across the channel 180. This also increases the series resistance, however, of the diffusion extensions 115, 125. The lengths of the diffusion extensions 115, 125 become significant compared to the length of the channel 180, and the increased series resistance of the diffusion extensions 115, 125 can result in performance degradation of the device 100.

FIG. 2 shows a device 200 formed upon a substrate 205. The device 200 uses raised source and drain diffusions 210, 220 to reduce problems associated with high series resistance of the source and drain diffusion regions and to reduce junction leakage caused by junctions with shallow source and drain diffusions. The device 200 includes isolation regions 250; oxide regions 232, 234, 236; diffusion contacts 240, 242; oxide or nitride spacers 266, 268; and a gate comprising a gate oxide 230, a heavily doped polysilicon gate 264, a gate conductor such as WSi$_x$ 262, and a nitride or oxide cap 260. The raised source and drain diffusions 210, 220 are formed by selective epitaxial (epi) silicon deposition. The selective epi process generally is prone to defect formation, causing diffusion-to-diffusion shorts as well as diffusion-to-gate shorts.

To overcome the shortcomings of conventional semiconductor devices, a new device is provided. An object of the present invention is to provide an improved semiconductor device that reduces short-channel effects. A related object is to provide a method of manufacturing such a semiconductor device. Another object is to provide a device having diffusions in the silicon substrate above the device channel area. Still another object is to provide a device suited for manufacture by a hybrid resist or phase-edge sub-lithographic technique. A further object of the present invention is to provide a method of controlling the length and thickness of diffusion extensions of a device.

SUMMARY OF THE INVENTION

To achieve these and other objects, and in view of its purposes, the present invention provides an apparatus that reduces short-channel effects and a method of manufacturing such an apparatus. The apparatus includes a substrate having a trench formed in it. The trench has sidewalls and a bottom. The device channel is formed below the bottom of the trench. A dielectric layer is formed on the sidewalls and the bottom of the trench. There are diffusion layers in the substrate adjacent to and on opposite sides of the trench. Diffusion extensions extend from each diffusion layer along the side of the trench to which the diffusion layer is adjacent and extend under a portion of the trench to the edge of the device channel. The diffusion extension thickness is less than the diffusion layer thickness.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Device

Figure 3:
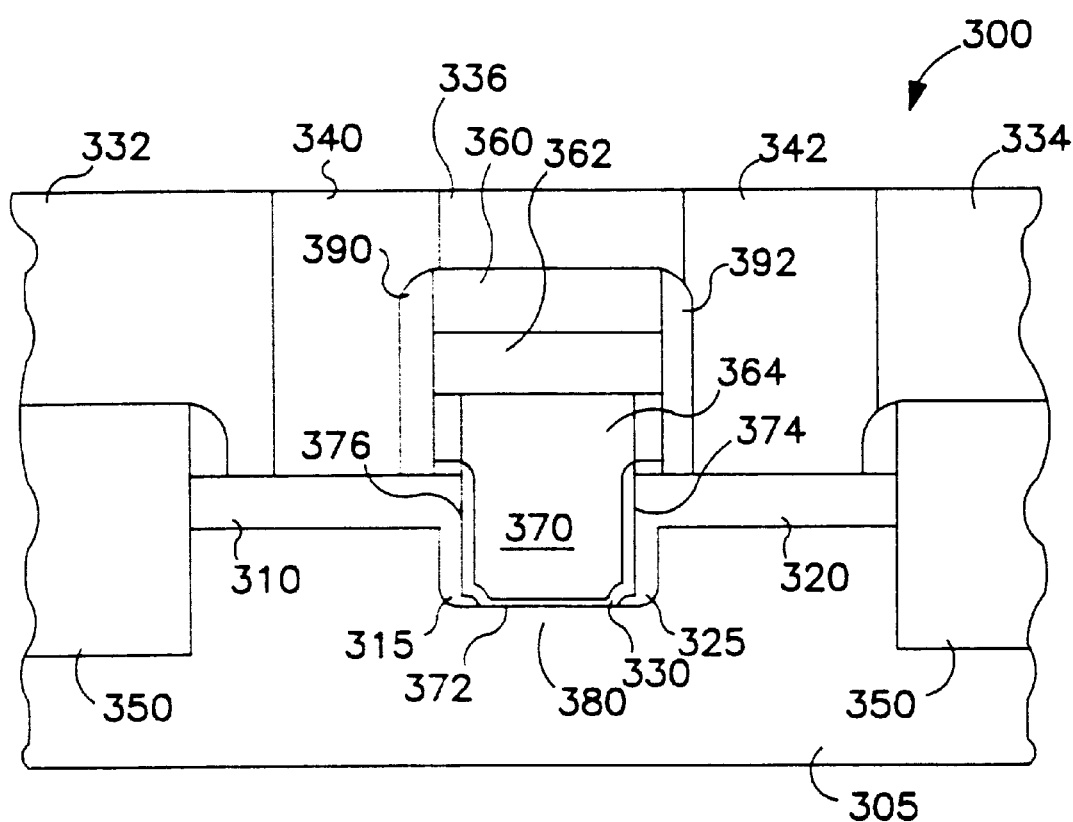
FIG. 3 is a sectional view illustrating an apparatus according to the present invention.
Figure 4:
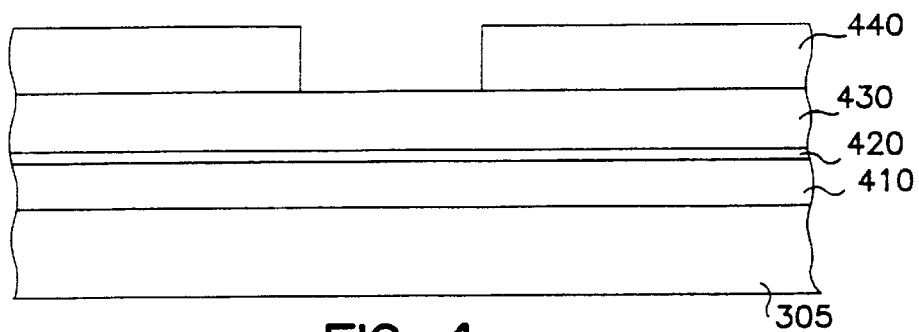
FIGS. 4–10 are sectional views illustrating a method of manufacture according to a first exemplary embodiment of the present invention.

Referring now to the drawing, wherein like reference numerals refer to like elements throughout, FIG. 3 shows an apparatus 300 according to an embodiment of the invention. A device channel 380 is formed adjacent the bottom of a trench 370 in a substrate 305. Diffusion layers 310, 320 are formed at the top surface of the substrate 305. The diffusion layers 310, 320 in the substrate 305 are above the device channel 380. The diffusion layers 310, 320 are connected to the edge of the device channel 380 by diffusion extensions 315, 325.

The apparatus 300 of the present invention includes a substrate 305 of a first polarity type. The trench 370 in the substrate 305 has sidewalls 374, 376 and a bottom 372. The sidewalls 374, 376 and the bottom 372 of the trench 370 are coated with a dielectric layer 330. A conductor 364 in the trench 370 is separated from the substrate 305 by the dielectric layer 330. In a preferred embodiment, the dielectric layer 330 on the sidewalls 374, 376 of the trench 370 is thicker than on the bottom 372 of the trench 370.

The diffusion layers 310, 320 have a second polarity type, are located on opposite sides of the trench 370, and have a thickness less than the depth of the trench 370. Thus, the bottom 372 of the trench 370 extends into the substrate 305 below the diffusion layers 310, 320.

Each diffusion layer 310, 320 has a diffusion extension 315, 325. The diffusion extension 315 extends from the diffusion layer 310 along the sidewall 376 of the trench 370 and under a portion of the bottom 372 of the trench 370 to the device channel 380. The diffusion extension 325 extends from the diffusion layer 320 along the opposite sidewall 374 of the trench 370 and under a portion of the bottom 372 of the trench 370 to the device channel 380.

In a preferred embodiment, the thicknesses of the portion of the diffusion extensions 315, 325 that extend under the bottom 372 of the trench 370 are less than the thicknesses of the portions of the diffusion extensions 315, 325 that extend along the sidewalls 374, 376 of the trench 370.

The invention is described below as applied to a NMOSFET device constructed in a silicon substrate, for example. The scope of this invention is neither limited to a particular type of device nor to a particular material of manufacture. The teachings of this invention can be applied by those skilled in the art to other devices such as PMOSFET devices.

For an NMOSFET device, the substrate 305 is p-type silicon. The dielectric layer 330 is an insulating layer preferably comprised of oxidized silicon. The conductor 364 in the trench 370 preferably comprises $n^+$ polycrystalline silicon (polysilicon). The gate of the device is wired by a conductive material 362 such as $WSi_x$ or W over the polysilicon 364. The device further includes a nitride layer 360; nitride spacers 390, 392; oxide layers 332, 334, 336; and diffusion contacts 340, 342.

For an NMOSFET device, the diffusion layers 310, 320 and the diffusion extensions 315, 325 are comprised of $n^+$ doped silicon. The diffusion layer and diffusion extension on one side of the trench 370 are the source region of the NMOSFET device, and the diffusion layer and diffusion extension on the opposite side of the trench 370 are the drain region of the NMOSFET device. The isolation regions 350 are preferably shallow trench isolation (STI) regions formed of $SiO_2$. In a preferred embodiment, the isolation regions 350 extend deeper into the silicon substrate 305 than the trench 370.

Figure 15:
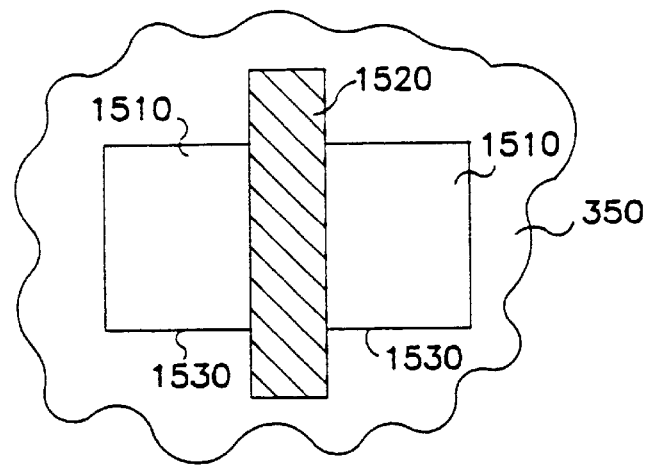
FIG. 15 is a top view illustrating a device with a gate that is not self-aligned to an isolation region.

In a preferred embodiment, the gate of the apparatus is self-aligned to the isolation region 350. As shown by a top view in FIG. 15, the gate 1520 of an apparatus is not self-aligned to the isolation region 350 and extends beyond the active area 1510 defined by the boundary 1530 and into the isolation region 350. This reduces apparatus density on a chip by limiting the proximity of adjacent apparatus to account for the extension of the gate 1520 into the isolation region 350.

Figure 16:
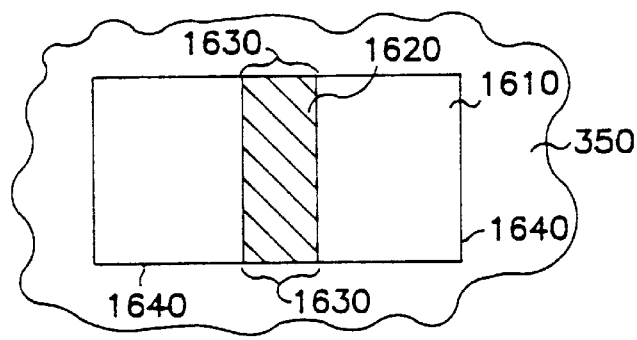
FIG. 16 is a top view illustrating a device having a gate that is self-aligned to an isolation region.

As shown by a top view in FIG. 16, the gate 1620 of an apparatus is self-aligned to the isolation region 350. The gate 1620 is formed only in the active area 1610 defined by the boundary 1640. The gate 1620 does not extend into the isolation region 350 beyond the boundary 1640. Thus, an increased apparatus density is possible because the gate 1620 does not have an extension which must be taken into account when positioning adjacent apparatus on a chip.

Figure 1:
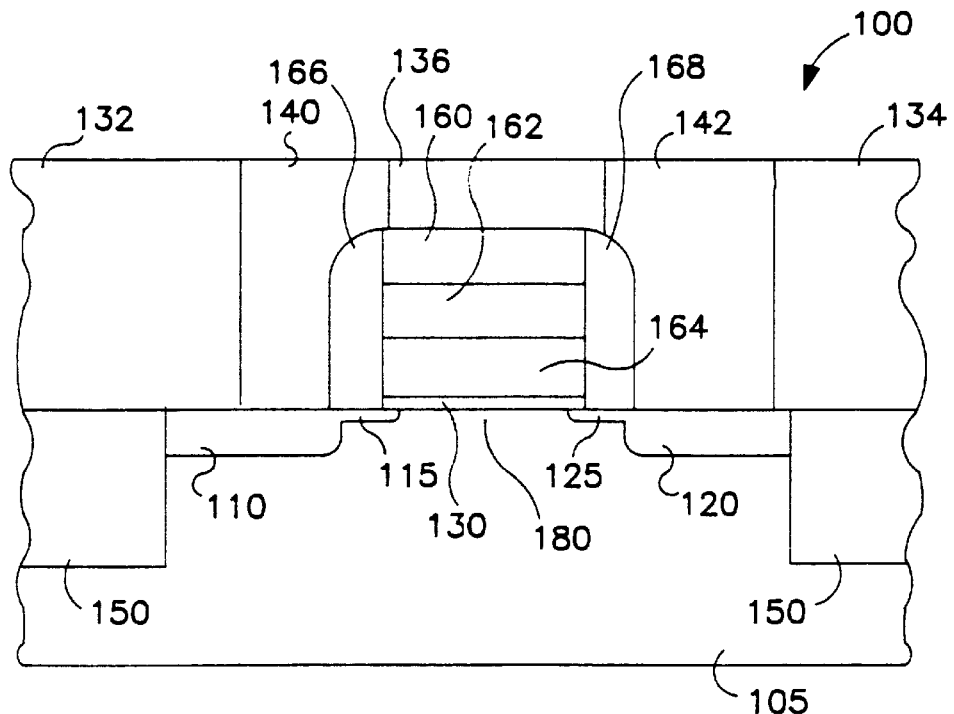
FIG. 1 is a sectional view illustrating a first conventional semiconductor device.
Figure 2:
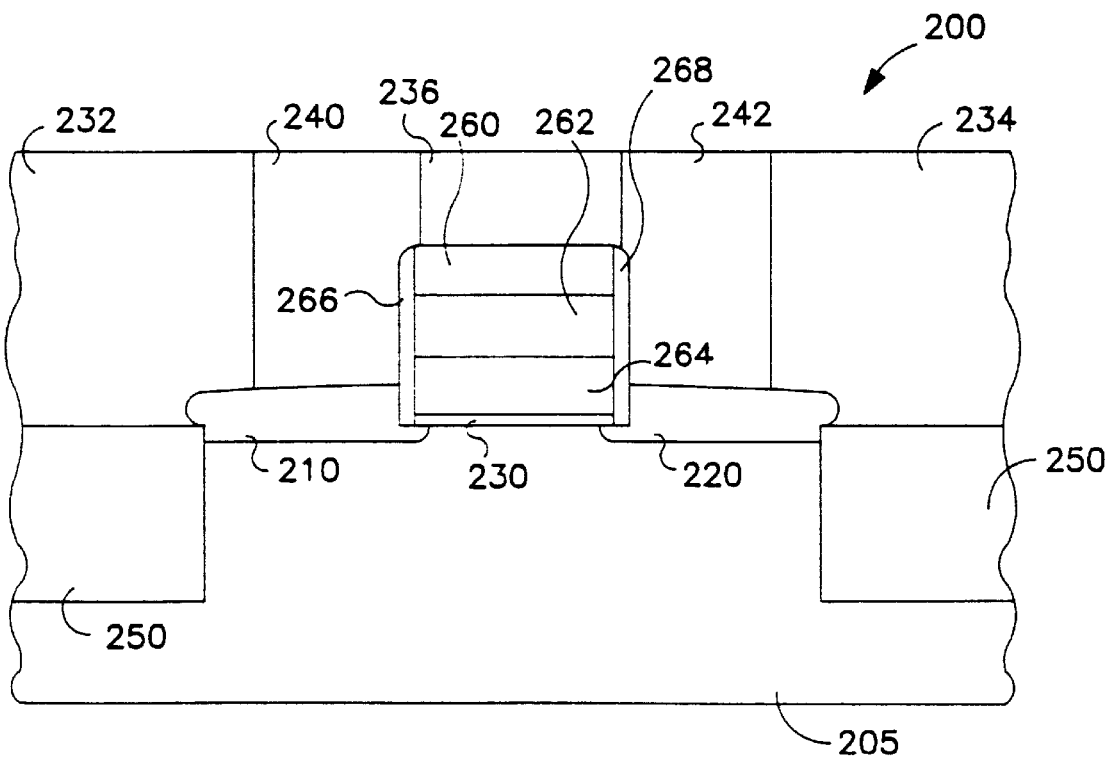
FIG. 2 is a sectional view illustrating a second conventional semiconductor device.

The apparatus 300 does not require selective epitaxial silicon deposition and thus is not prone to defect formation associated with the selective epitaxial process as was device 200 in FIG. 2. The apparatus 300 does not require lengthening of the diffusion extensions as the sole way to isolate the deep diffusions. Thus, the apparatus 300 does not have a performance degradation due to the resistance of long diffusion extensions as was seen in device 100 of FIG. 1.

The apparatus 300 includes diffusion extensions 315, 325 that have a greater vertical dimension than a horizontal dimension. This permits the manufacture of an apparatus 300 of smaller dimensions resulting in an increased apparatus density on a chip. The diffusion layers 310, 320 can have sufficient depth for diffusion contacts while the trench 370 provides isolation to reduce short-channel effects such as the drain-induced barrier-lowering and device subthreshold leakage current. The trench 370 allows the self-alignment of the source and drain regions to the gate of the apparatus.

Methods of Manufacture

The device of this invention can be built by a series of semiconductor process steps. Two example methods of manufacture are described below. Both methods include the following steps (not necessarily in order): 1) forming a diffusion layer in a substrate surface; 2) etching a trench into a substrate; 3) doping the sidewalls of the trench to extend the diffusion layer on the substrate surface to the bottom of the trench; and 4) forming a device channel under the bottom of the trench.

The first method forms the active device first and then forms an isolation region around the active device. The second method defines the active area of the device by forming the isolation region first and then forming the active device in the active area.

The methods of the present invention are described below as applied in the manufacture of a NMOSFET device constructed in a silicon substrate. The scope of the methods of this invention is neither limited to a particular type of device, however, nor to a particular material of manufacture. The teachings of this invention can be applied by those skilled in the art to other devices such as PMOSFET devices.

A. First Method: Active-Device-First Method

The first method of manufacturing the apparatus 300 is described with reference to FIGS. 4–10. As shown in FIG.

4, a silicon substrate 305 of a first polarity type (p-type for NMOSFET) is doped, by ion implantation for example, to form a diffusion layer 410 of a second polarity type ($n^+$ for NMOSFET). An oxide layer 420 is formed upon the diffusion layer 410. Preferably, the oxide layer 420 is first grown on the silicon substrate 305 and then the surface of the silicon substrate 305 is doped, by ion implantation for example, to form the diffusion layer 410. A nitride layer 430 is formed upon the oxide layer 420, by chemical vapor deposition (CVD) for example. The pattern for trench 370 is then defined with a photo resist 440. The pattern for trench 370 may be defined by lithography or by sublithographic techniques, such as phase-edge lithography or a hybrid resist technique. The hybrid resist technique is taught by Hakey et al., *Frequency Doubling Hybrid Photoresist*, U.S. application Ser. No. 08/715,287, filed Sep. 16, 1996, to be incorporated herein by reference.

Figure 5:
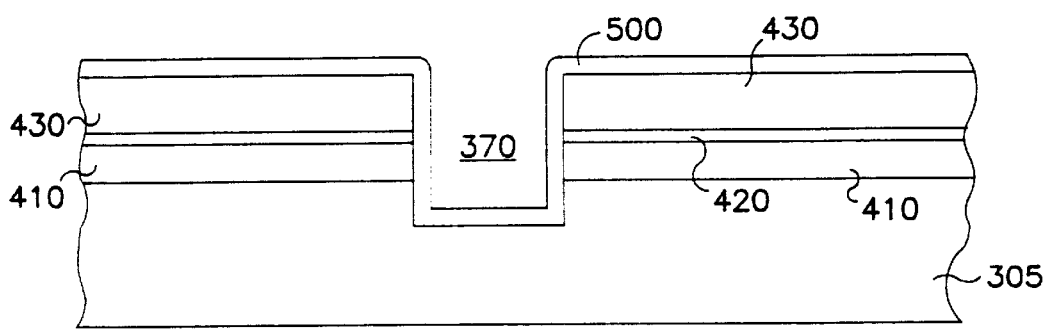

As shown in FIG. 5, the trench 370 is etched into the silicon substrate 305 beyond the $n^+$ diffusion layer 410. The photoresist 440 is removed. A diffusible layer 500 is deposited upon the nitride layer 430 and inside the trench 370. The diffusible layer 500 may be doped glass such as arsenic doped glass (ASG) for an NMOSFET. The diffusible layer 500 is of the same polarity type as the diffusion layer 410.

Figure 6:
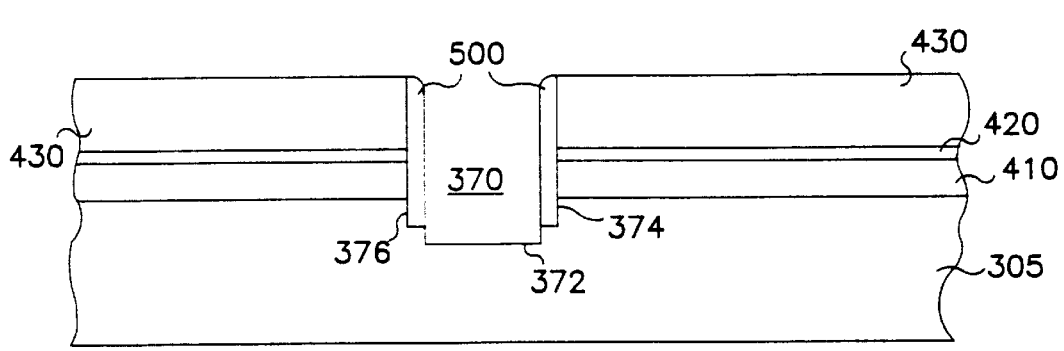

As shown in FIG. 6, the diffusible layer 500 is etched from the bottom 372 of the trench 370, leaving the diffusible layer 500 on the sidewalls 374, 376 of the trench 370. The diffusible layer 500 may be etched from the bottom 372 of the trench 370 by an anisotropic or directional etching process, for example. In a preferred embodiment, as shown in FIG. 6, the bottom 372 of the trench 370 is etched down further into the silicon substrate 305 than the diffusible layer 500 on the sidewalls 374, 376. This results in a center portion of the trench 370 that is deeper into the substrate 305 than the diffusible layer 500 coated sidewalls 374, 376 of the trench 370.

Figure 7:
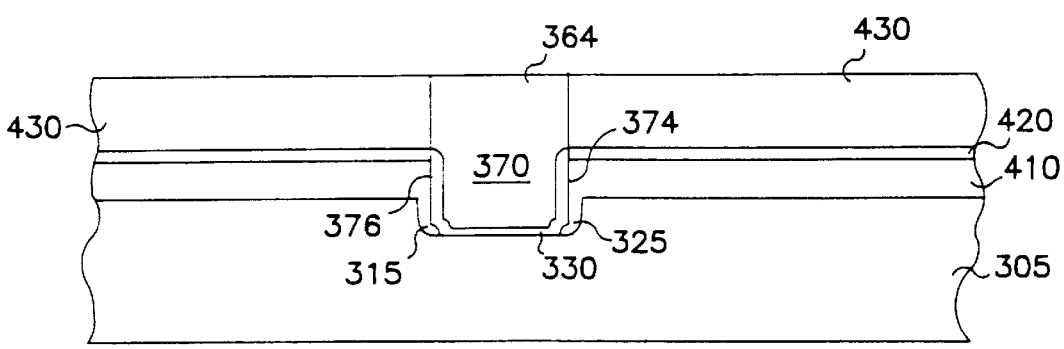

As shown in FIG. 7, the sidewalls 374, 376 are doped by out-diffusion from the diffusible layer 500. This can be done by annealing the diffusible layer 500 and the substrate 305 so the diffusible element in the diffusible layer 500 diffuses into the substrate 305 adjacent the sidewalls 374, 376 and adjacent a portion of the bottom 372 of the trench 370. The out-diffusion forms the diffusion extensions 315, 325 which extend from the diffusion layers 310, 320 down the sidewalls 374, 376 of the trench 370 and under a portion of the bottom 372 of the trench 370.

The length of the portion under the bottom 372 of the trench 370 that the diffusion extensions 315, 325 extend is variable with the duration and temperature of annealing and with the thickness of the diffusible layer 500 on the sidewalls 374, 376 of the trench 370. For example, the portion of the diffusion extensions 315, 325 under and adjacent the bottom 372 of the trench 370 may be made longer by making the diffusible layer 500 on the sidewalls 374, 376 thicker.

The effective junction depth of the apparatus 300 is the thickness of the diffusion extensions 315, 325 extending beyond the bottom 372 of the trench 370. The effective junction depth is variable with the duration and temperature of annealing and the extent to which the bottom 372 of the trench 370 is etched beyond the bottom of the diffusible layer 500 on the sidewalls 374, 376 (see FIG. 6).

Increasing the annealing temperature and/or increasing the annealing duration will increase the effective junction depth by creating thicker diffusion extensions 315, 325. For a given thickness of diffusion extension 315, 325, further etching the bottom 372 of the trench 370 beyond the bottom of the diffusible layer 500 on the sidewalls 374, 376 will reduce the effective junction depth.

The variability in the effective junction depth permits adjustment of device parameters such as turn on/off characteristics. In addition, the channel length of a device can be decreased if the effective junction depth is reduced.

In a preferred embodiment, a layer of undoped glass (not shown) is deposited upon the diffusible layer 500. This prevents the diffusible element in the diffusible layer 500 (e.g., arsenic if using ASG to manufacture a NMOSFET) from escaping into the air during the out-diffusion. The diffusible layer 500 is then stripped, sacrificial oxide is grown, and gate tailor implant is made at the bottom of the trench 370. Gate oxide 330 is grown after the sacrificial oxide is stripped.

It is preferable to have a thicker layer of oxide 330 grown on the sidewalls 374, 376 of the trench 370 than on the bottom 372 of the trench 370 to reduce the parasitic capacitance of the device. The oxide 330 can be grown thicker on the sidewalls 374, 376 by growing the oxide 330 over the heavily doped diffusion layer 410 adjacent the sidewalls 374, 376, because the oxide 330 will grow faster over the heavily doped diffusion layer 410 than over the substrate 305 at the bottom 372 of the trench. The oxide 330 can also be made thicker on the sidewalls 374, 376 by growing the oxide 330 without stripping the diffusible layer 500.

A conductor 364 is then deposited and planarized to the surface of the nitride layer 430. In a preferred embodiment, the conductor 364 is $n^+$ polysilicon.

Figure 8:
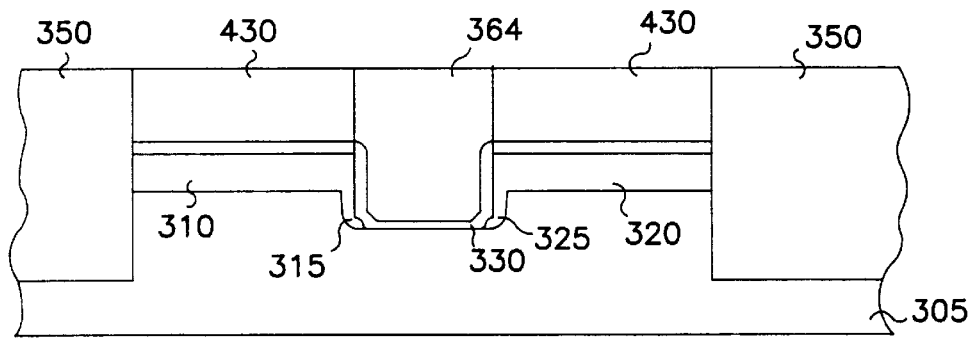

As shown in FIG. 8, isolation regions 350 are etched down into the silicon substrate 305. The isolation regions 350 can be shallow trench isolation (STI) regions and can be etched using a photo resist as a mask. Upon etching an isolation trench, the exposed silicon in the isolation trench can be oxidized and the isolation trench filled with $SiO_2$ and planarized to the surface of the nitride 430. In a preferred embodiment, the isolation regions 350 extend deeper into the silicon substrate 305 than the trench 370 to reduce a parasitic source-to-drain leakage path at the gate-to-isolation boundary 1630 (see FIG. 16).

In a preferred embodiment, the gate 1620 of the device is self-aligned to the isolation region 350 as shown in FIG. 16. As shown in FIG. 8, a self-aligned gate is formed by cutting the gate trench 370 when etching the isolation region 350.

Figure 9:
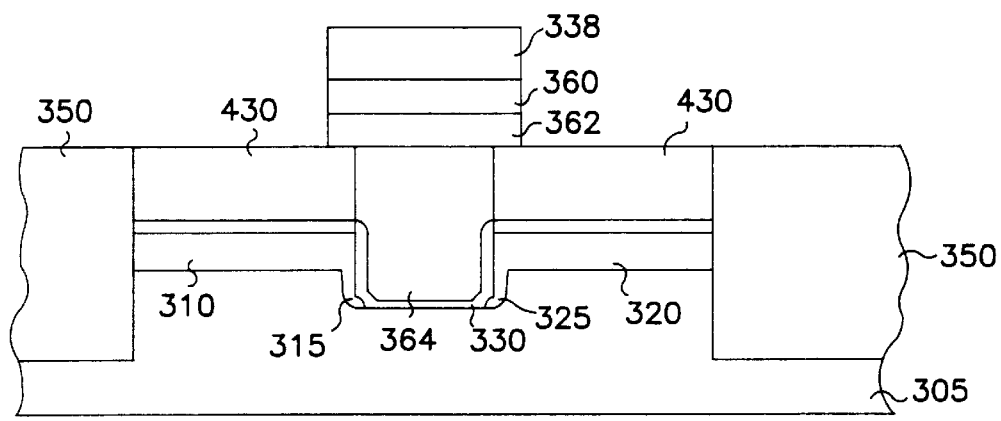

As shown in FIG. 9, a wiring conductor material 362 and a nitride layer 360 are deposited. The wiring conductor 362 and the nitride layers 360, 430 are etched in a stack defined by photoresist 338 to form the gate wiring. In a preferred embodiment, the wiring conductor 362 is $WSi_x$ or W.

Figure 10:
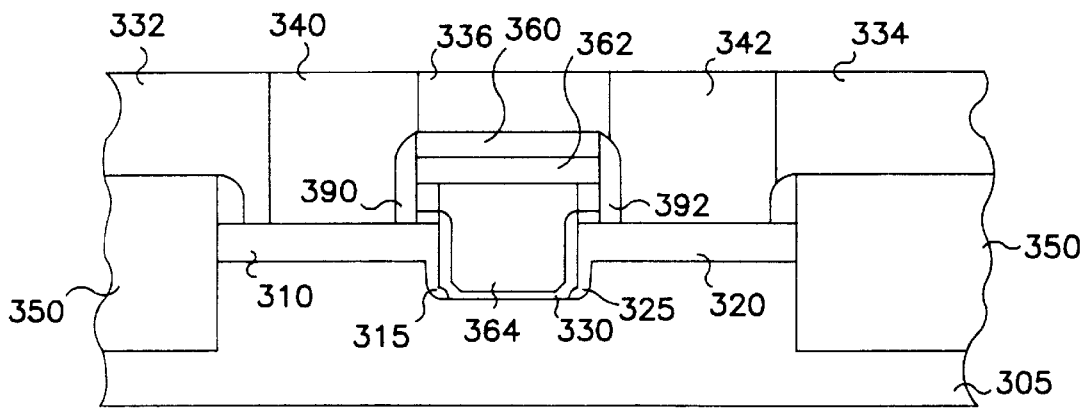

As shown in FIG. 10, spacers 390, 392, preferably of nitride, are formed; dielectric material 332, 334, 336 is deposited; and diffusion contacts 340, 342 are formed.

B. Second Method: Isolation-First Method

Figure 11:
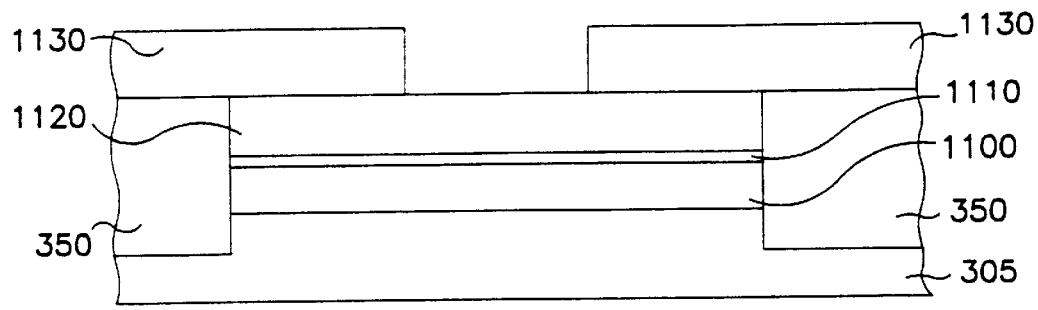
FIGS. 11–14 are sectional views illustrating a method of manufacture according to a second exemplary embodiment of the present invention.

The second method of manufacturing the apparatus 300 is described with reference to FIGS. 11–14 and 17. As shown in FIG. 11, the device isolation regions 350 are formed, for example, by a $SiO_2$ filled STI region before defining the device trench 370 area.

First, a doped layer 1100 and an oxide layer 1110 are formed. Preferably, the oxide layer 1110 is grown on the silicon substrate 305 and then the surface of the silicon substrate 305 is doped, by ion implantation for example, to form the doped layer 1100. A nitride layer 1120 is then deposited upon the oxide layer 1110, by CVD for example. Then the isolation regions 350 are formed by etching a trench into the substrate 305 and filling the trench with an insulator such as $SiO_2$, for example. The active area of the device is defined to be within the isolation regions 350. The pattern for trench 370 is then defined with a photo resist 1130. In a preferred embodiment, the trench 370 pattern is defined using a hybrid-resist technique or phase-edge lithography.

Figure 12:
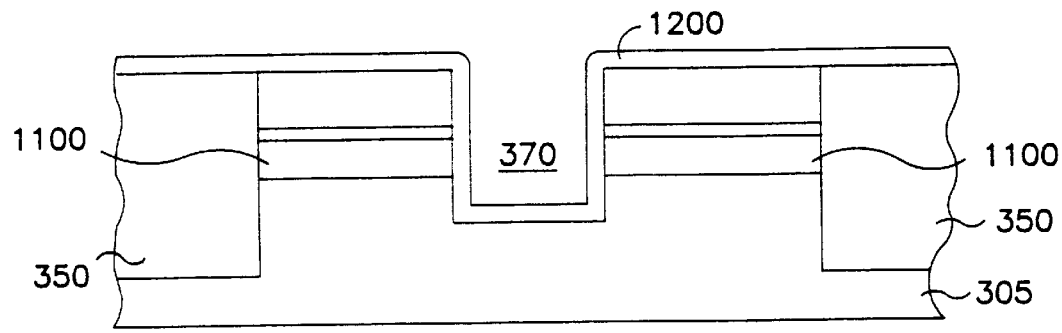

As shown in FIG. 12, the trench 370 is then etched into the substrate 305 beyond the doped layer 1100. In a preferred embodiment, the isolation regions 350 extend deeper into the silicon substrate 305 than the trench 370 to reduce a parasitic source-to-drain leakage path at the gate-to-isolation boundary 1630 (see FIG. 16). Also in a preferred embodiment, as shown in FIG. 16, the gate 1620 is self-aligned to the isolation region 350 which allows an increased density for apparatus 300 on a chip.

Figure 17:
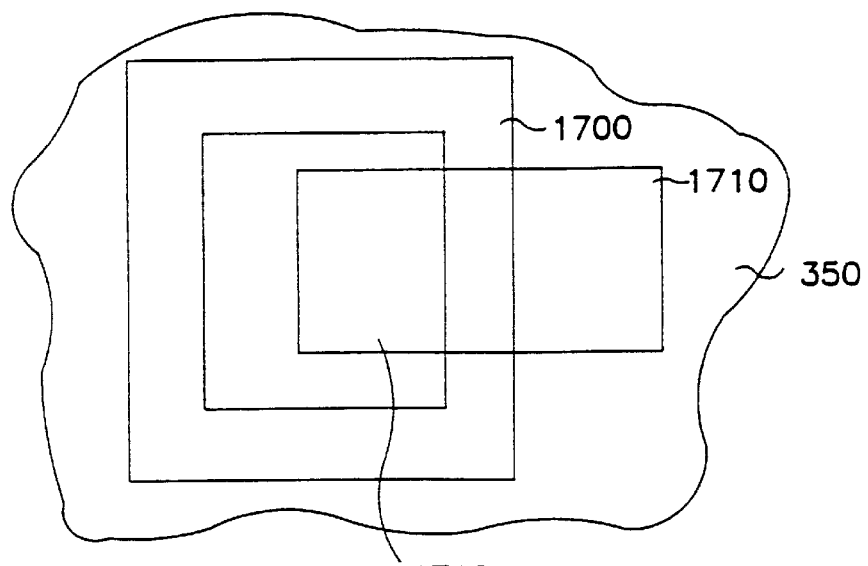
FIG. 17 is a top view illustrating a method according to the second exemplary embodiment of the present invention.

A self-aligned gate 1620 may be formed by forming a loop of space 1700 in a photoresist as shown in FIG. 17. The loop of space 1700 crosses the active area 1710 where the gate 1620 is to be etched. In a preferred embodiment, the loop of space 1700 is formed by a hybrid resist technique. The gate 1620 is then formed by a selective etching process that etches the silicon substrate 305 in the active area 1610 but not the isolation region 350. This results in a gate 1620 that is self-aligned with the isolation region 350 without requiring additional steps for trimming the loop of space 1700 in the photoresist.

Figure 13:
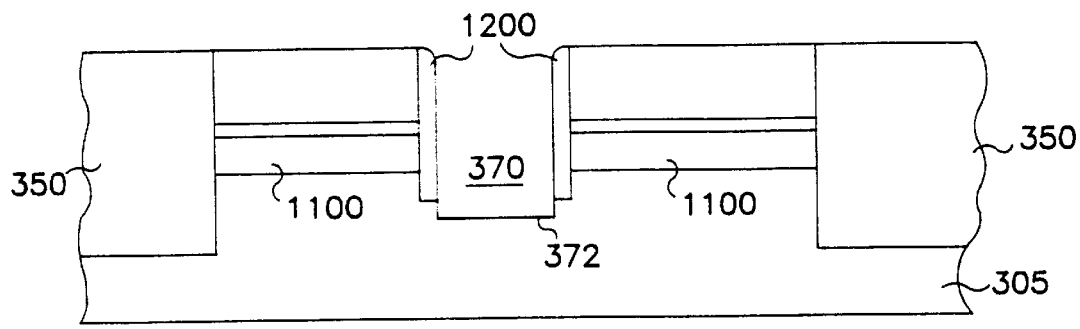

Returning to FIG. 12, after the trench 370 is etched, a diffusible layer 1200 such as ASG is then deposited. As shown in FIG. 13, the diffusible layer 1200 is etched from the bottom 372 of the trench 370 leaving the diffusible layer 1200 on the sidewalls 374, 376 of the trench 370. In a preferred embodiment, as shown in FIG. 13, the bottom 372 of the trench 370 is etched down further into the silicon substrate 305 than the diffusible layer 1200. This results in a center portion of the trench 370 that is deeper into the substrate 305 than the diffusible layer 1200 coated sidewalls 374, 376 of the trench 370.

Figure 14:
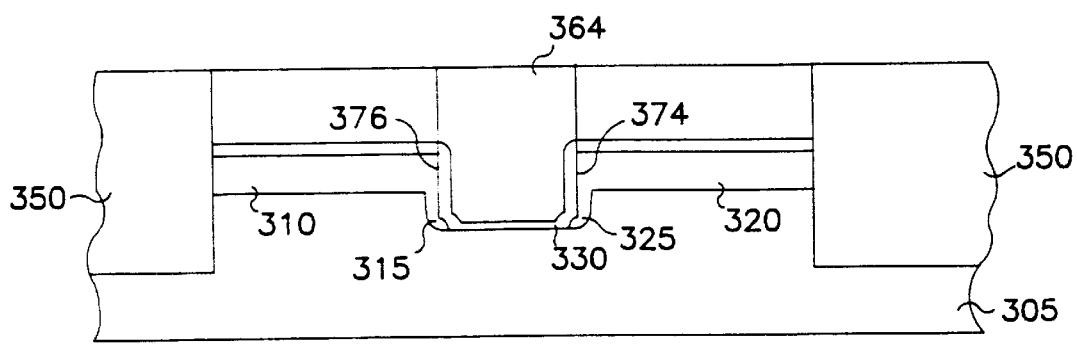

As shown in FIG. 14, the sidewalls 374, 376 of the trench 370 are doped by out-diffusion from the doped glass diffusible layer 1200. The diffusible layer 1200 is then stripped, sacrificial oxide is grown, and gate tailor implant is made at the bottom of the trench 370. Dielectric layer 330 is grown after the sacrificial oxide is stripped. A conductor 364, preferably doped polysilicon, is then deposited in the trench 370 and planarized to the nitride surface.

The remaining steps for the second method are similar to those of the first method described above with reference to FIGS. 9–10, and for brevity will not be repeated.

Exemplary embodiments of the present invention are shown in FIGS. 18–21, any of which can be manufactured by either of the first and second methods of manufacture according to the present invention. With reference to FIG. 3, the exemplary embodiments illustrate a first variation in the formation of the bottom 372 of a trench 370 of an apparatus 300 and illustrate a second variation in the thickness of the dielectric layer 330 on the sidewalls 374, 376 of an apparatus 300.

Figure 18:
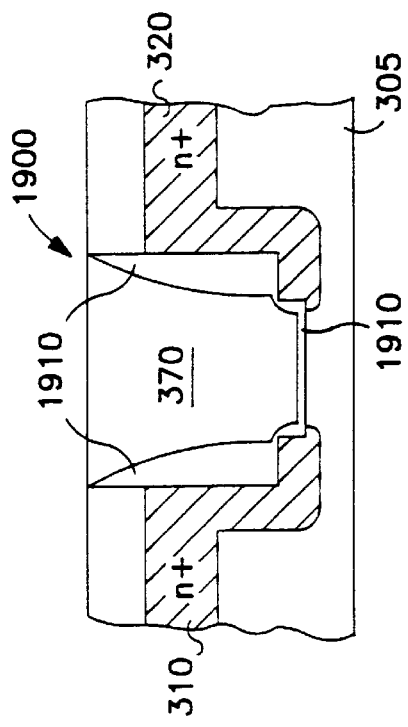
FIGS. 18–21 are partial sectional views illustrating exemplary embodiments of devices according to the present invention.
Figure 19:
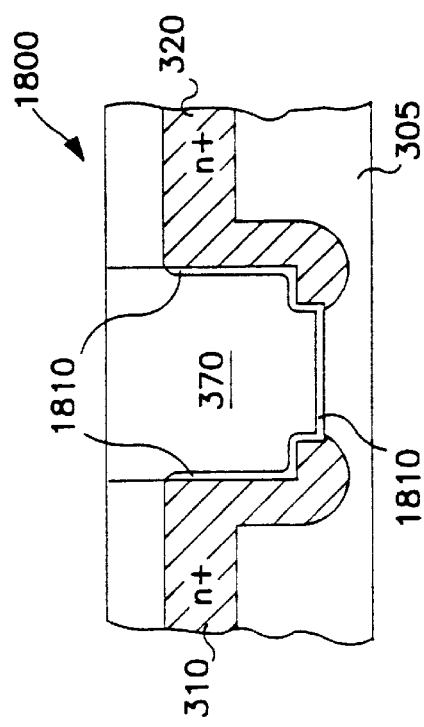
Figure 20:
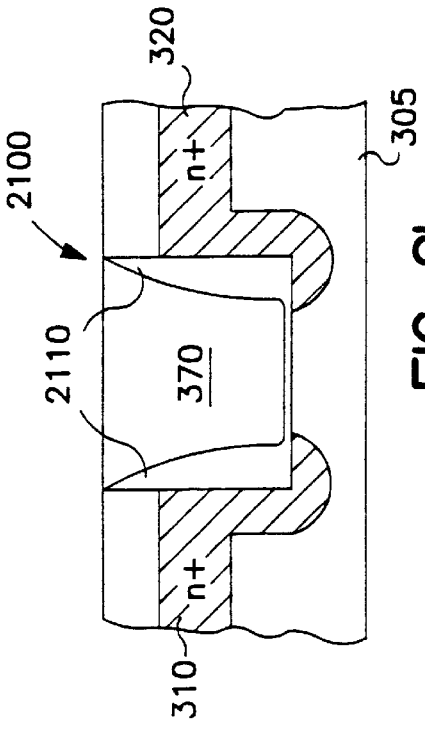
Figure 21:
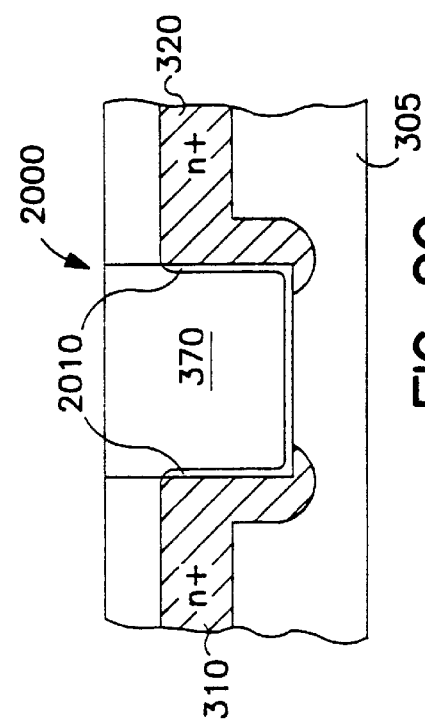

The first variation was discussed previously with reference to FIGS. 6 and 13. As shown in FIGS. 6 and 13, after the diffusible layer 500, 1200 is deposited, the diffusible layer 500, 1200 is etched from the bottom 372 of the trench 370. The bottom 372 of the trench 370 is then further etched into the substrate 305. The bottom 372 of the trench 370 is then below the bottom of the diffusible layer 500, 1200 coated sidewalls 374, 376 of the trench 370. FIGS. 18 and 19 show exemplary embodiments of the present invention where the trench 370 is formed as described above. FIGS. 20 and 21 show exemplary embodiments of the present invention where the diffusible layer 500, 1200 is etched from the bottom 372 of the trench 370, but the bottom 372 of the trench 370 is not further etched into the substrate 305. The extent to which the bottom 372 of the trench 370 is etched beyond the diffusible layer 500, 1200 coated sidewalls 374, 376 and into the substrate may determine the effective junction depth of an apparatus.

The apparatus 1900, 2100 in FIGS. 19 and 21 illustrate the second variation. A thicker insulator 1910, 2110 is formed on the sidewalls 374, 376 of the trench 370 by not stripping the diffusible layer 500, 1200 before growing the gate oxide 1910, 2110. The apparatus 1900 is formed as shown in FIGS. 6 and 13 where the diffusible layer 500, 1200 is etched from the bottom 372 of the trench 370 and the bottom 372 is further etched into the substrate 305. The diffusion extensions 315, 325 are formed by the out-diffusion of the diffusible layer 500, 1200. The diffusible layer 500, 1200 is not removed from the sidewalls 374, 376 of the trench 370 before the gate oxide 1910 is grown.

The gate oxide 2110 on apparatus 2100 was also grown without removing the diffusible layer 500, 1200, but the bottom 372 of the trench 370 of apparatus 2100 was not etched into the substrate 305 below the diffusible layer 500, 1200 on the sidewalls 374, 376 of the trench 370. The gate oxide 1810, 2010 of apparatus 1800, 2000 shown in FIGS. 18 and 20 is grown after the diffusible layer 500, 1200 is stripped from the sidewalls 374, 376 of the trench 370 after the out-diffusion of the diffusible layer 500, 1200.

When the diffusible layer 500, 1200 is not removed before the gate oxide 1910, 2110 is formed, a separate annealing step to cause the out-diffusion of the diffusible layer 500, 1200 may not be required. This is possible because out-diffusion of the diffusible layer 500, 1200 may occur while growing the gate oxide 1910, 2110 upon the diffusible layer 500, 1200.

Table 1 below summarizes the variations illustrated in devices 1800, 1900, 2000, and 2100 in FIGS. 18–21.

| Apparatus | Trench bottom etched beyond diffusible layer? | Diffusible layer on sidewalls removed before gate oxide formed? |
| --- | --- | --- |
| 1800 | YES | YES |
| 1900 | YES | NO |
| 2000 | NO | YES |
| 2100 | NO | NO |

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. An apparatus comprising:

a substrate;

a trench extending a trench depth into the substrate, the trench having a first sidewall, a second sidewall opposite the first sidewall, and a bottom;

a dielectric layer on the sidewalls and the bottom of the trench;

a conductor in the trench separated from the first and second sidewalls and bottom of the trench by the dielectric layer;

first and second diffusion layers extending a first thickness into the substrate, the first diffusion layer adjacent the first sidewall and the second diffusion layer adjacent the second sidewall, wherein the first thickness is less than the trench depth; and first and second diffusion extensions in the substrate extending from the first and second diffusion layers along the first and second sidewalls, respectively, and under a portion of the bottom of the trench, the first and second diffusion extensions having a second thickness less than the first thickness.

2. The apparatus according to claim 1, wherein the dielectric layer on the sidewalls of the trench is thicker than the dielectric layer on the bottom of the trench.

3. The apparatus according to claim 1, wherein the conductor in the trench comprises polycrystalline silicon.

4. The apparatus according to claim 1, wherein the dielectric layer comprises oxidized silicon.

5. The apparatus according to claim 1, wherein the apparatus is a MOSFET device.

6. The apparatus according to claim 5, wherein the diffusion layer on a first side of the trench is a source region and the diffusion layer on a second side of the trench, opposite the first side of the trench, is a drain region.

7. The apparatus according to claim 6, further comprising:
an isolation region;
a gate region self-aligned to the isolation region; and
an active area comprising the source region, the drain region, and the gate region, the active area bound by the isolation region.

8. The apparatus according to claim 1, wherein the thickness of a portion of the diffusion extensions along the sidewalls of the trench is greater than or equal to the thickness of a portion of the diffusion extensions under a portion of the bottom of the trench.

9. The apparatus according to claim 1, wherein:
the substrate is of a first polarity type;
the diffusion layers are of a second polarity type; and
the diffusion extensions are of the second polarity type.

10. A semiconductor device comprising:
a semiconductor substrate of a first polarity type;
a trench extending a trench depth into the semiconductor substrate, the trench having a first sidewall, a second sidewall opposite the first sidewall, and a bottom;
a dielectric layer on the sidewalls and the bottom of the trench;
a conductor in the trench separated from the first and second sidewalls by the dielectric layer;
a source region comprising:
i) a first diffusion layer of a second polarity type in the semiconductor substrate adjacent the first sidewall of the trench, the first diffusion layer extending a first thickness into the substrate, the first thickness less than the trench depth, and
ii) a first diffusion extension of the second polarity type extending from the first diffusion layer along the first sidewall of the trench toward the bottom of the trench and extending along and under a portion of the bottom of the trench;
a drain region comprising:

i) a second diffusion layer of the second polarity type in the semiconductor substrate adjacent the second sidewall of the trench, the second diffusion layer extending a second thickness into the substrate, the second thickness less than the trench depth, and
ii) a second diffusion extension of the second polarity type extending from the second diffusion layer along the second sidewall of the trench toward the bottom of the second sidewall of the trench and extending under a portion of the bottom of the trench.

11. The semiconductor device according to claim 10, wherein the conductor is polysilicon.

12. The semiconductor device according to claim 10, further comprising:
an isolation region;
a gate region self-aligned to the isolation region; and
an active area comprising the source region, the drain region, and the gate region, the active area bound by the isolation region.

13. The semiconductor device according to claim 12, further comprising:
a wiring conductor material upon the conductor;
a nitride layer upon the wiring conductor material;
a contact diffusion upon the source region;
a contact diffusion upon the drain region; and
oxide regions upon the isolation region and upon the nitride layer.

14. The semiconductor device according to claim 10, wherein
a portion of the first diffusion extension along the first sidewall has a thickness greater than or equal to a thickness of a portion of the first diffusion extension under a portion of the bottom of the trench; and
a portion of the second diffusion extension along the second sidewall has a thickness greater than or equal to a thickness of a portion of the second diffusion extension under a portion of the bottom of the trench.

15. An apparatus according to claim 1 wherein the bottom of the trench is substantially planar.

16. An apparatus according to claim 1 wherein the first and second diffusion layers and the first and second diffusion extensions are comprised of $n^+$ doped silicon.

17. An apparatus according to claim 1 wherein the trench has a first end and a second end opposite the first end and the apparatus further comprises an isolation region formed in the substrate adjacent the first and second ends of the trench wherein the first and second diffusion layers extend along the first and second sidewalls between the first and second ends of the trench and the first and second diffusion extensions extend along the first and second sidewalls and the bottom of the trench between the first and second ends of the trench.

18. An apparatus according to claim 17 wherein the isolation region extends deeper into the substrate than the diffusion extensions.

* * * * *